United States Patent [19]

Gantioler

[11] Patent Number: 5,298,789
[45] Date of Patent: Mar. 29, 1994

[54] SEMICONDUCTOR COMPONENT FOR A HIGH BLOCKING BIAS

[75] Inventor: Josef M. Gantioler, Munich, Fed. Rep. of Germany

[73] Assignee: Siemens Aktiengesellschaft, Munich, Fed. Rep. of Germany

[21] Appl. No.: 783,812

[22] Filed: Oct. 29, 1991

[30] Foreign Application Priority Data

Nov. 12, 1990 [EP] European Pat. Off. ........ 90121644.0

[51] Int. Cl.⁵ .................. H01L 29/780; H01L 29/400
[52] U.S. Cl. ..................................... 257/620; 257/409; 257/652; 257/659
[58] Field of Search ............... 257/409, 620, 630, 394, 257/652, 659, 488, 490

[56] References Cited

U.S. PATENT DOCUMENTS

| | | | |
|---|---|---|---|
| 3,763,406 | 10/1973 | Bosselaar | 317/235 R |
| 4,419,685 | 12/1983 | Sugawara et al. | 257/557 |
| 4,633,292 | 12/1986 | Fellinger et al. | 257/394 |
| 4,713,681 | 12/1987 | Beasom | 357/52 |
| 4,825,278 | 4/1989 | Hillenius et al. | 257/630 |

FOREIGN PATENT DOCUMENTS

| | | | |
|---|---|---|---|
| 0077481 | 4/1983 | European Pat. Off. | 257/488 |
| 0095755 | 12/1983 | European Pat. Off. | 257/630 |
| 3220250 | 12/1983 | Fed. Rep. of Germany | 257/630 |
| 0132358 | 6/1987 | Japan | 257/409 |

OTHER PUBLICATIONS

"Practical Size Limits of High Voltage IC's", by Sugawara et al., International Electron Devices Meeting, Washington, D.C., Dec. 5-7, 1983, Electron Devices Society of IEEE, pp. 412-415.

*Primary Examiner*—Rolf Hille
*Assistant Examiner*—Alexander Oscar Williams
*Attorney, Agent, or Firm*—Hill, Steadman & Simpson

[57] ABSTRACT

Semiconductor components having planar structures such as MOSFETs, bipolar transistors, and isolated gate bipolar transistors are provided with field plates (5) and, potentially, with guard rings for increasing the blocking bias. A further improvement can be achieved when the zone adjoining the surface of the semiconductor body has its surface outside the planar zones (3) provided with a region (9) that has the same conductivity type as the zone and a higher doping concentration than this zone.

3 Claims, 1 Drawing Sheet

SEMICONDUCTOR COMPONENT FOR A HIGH BLOCKING BIAS

BACKGROUND OF THE INVENTION

The present invention is directed to a semiconductor component having a semiconductor body having a first zone of a first conductivity type and at least one planar zone of a second conductivity type arranged in this zone, having at least one field plate that is electrically connected to the planar zone and that extends in a direction toward an edge of the semiconductor body, and having a channel barrier at the edge of the semiconductor body.

For example, German Published Application 32 20 250 has disclosed a semiconductor component of this type. The planar zone of this semiconductor component is connected to a field plate that extends to the edge of the semiconductor component. As known, the field strength at the surface of the semiconductor body can be made uniform with this field plate and, thus, an overall increase in the blocking bias can be achieved.

A further increase in the blocking bias can be achieved in accordance with German Published Application 32 20 250 in that at least one protective zone that is in turn electrically connected to a respective field plate is arranged between the planar zone and the edge of the semiconductor body. This field plate also extends in the direction toward the edge of the semiconductor body. A further improvement in the breakdown strength can be achieved in that the field plates have a respectively increasing distance from the surface of the semiconductor body toward the edge of the semiconductor body. This can also be achieved by steps or by a combination of a plurality of field plates that are parallel to the surface and that are arranged above one another and offset relative to one another.

SUMMARY OF THE INVENTION

It is an object of the present invention to provide a semiconductor component wherein a further increase in the blocking bias is possible with minimum outlay.

This object is achieved in that a region of the first conductivity type that has a higher conductivity than the first zone is provided at the surface of the first zone outside the planar zone. In a development of the present invention the region extends from the channel barrier under the field plate.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
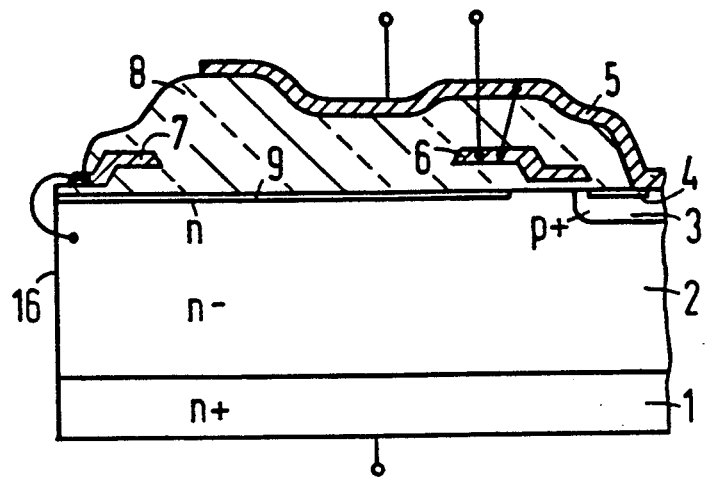
FIG. 1 is a cross-sectional view of a vertical power MOSFET.

FIG. 1 shows a vertical power MOSFET. It has a semiconductor body having a highly n-doped substrate 1 at which a lightly n-doped, first zone 2 is adjacent. A highly p-doped planar zone 3 is embedded into the surface of the first zone 2. This planar zone 3 serves as the gate zone of the power MOSFET. An n-doped zone 4 is embedded in the planar zone 3, this zone 4 being the source zone of the power MOSFET. This zone itself, however, plays no part in the present invention.

The planar zone 3 is electrically connected to a field plate 5 that extends in a direction toward an edge 16 of the semiconductor body. It is arranged on an insulating layer 8. The field plate 5 is electrically connected to a gate electrode 6 lying there below. The gate electrode 6 serves, on the one hand, for controlling the power MOSFET and, on the other hand, as field electrode. The field electrode 5 and the gate electrode 6 act like a single field plate due to their electrical connection, this single field plate having an increasing distance from the surface of the semiconductor body in the direction toward the edge of the semiconductor body 16.

At its surface, the first zone 2 contains a region 9 of the same conductivity type as the first zone 2 but having a higher doping. The region 9 extends from the edge of the semiconductor body to under the gate electrode 6. However, it can also abut the planar zone 3 when this does not lead to an inadmissibly high field strength under the low part of the gate electrode 6. It is also not compulsory that the region 9 extends up to the edge of the semiconductor body. On the contrary, it can end under the channel barrier 7.

The effect of the region 9 is that the field strength at the surface of the semiconductor body becomes uniform. Field strength peaks under the channel stopper are thus dismantled and a higher blocking bias is achieved.

The region 9 can be generated, for example, by implantation of arsenic. When the arsenic is implanted before the necessary diffusion steps for the other zones, then it has a thickness of, for example, 0.5 μm in the finished condition of the component. Its surface charge is dependent on the doping of the first zone 2. Given a specific resistance of 60 ohms/cm of the zone 2, it yields an optimum for the blocking bias with a value of $1.2 \times 10^{12}/cm^2$. Given a specific resistance of 80 ohms/cm, it yields an optimum given a surface charge of greater than $2 \times 10^{12}/cm^2$. An upper limit of $4 \times 10^{12}/cm^2$ seems meaningful for higher specific resistances.

Figure 2:
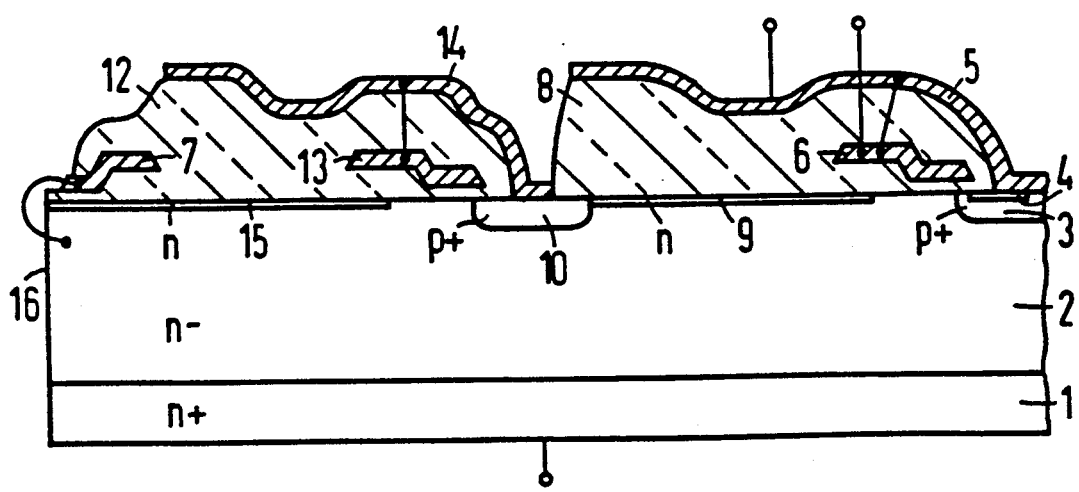
FIG. 2 is a cross-sectional view of a vertical power MOSFET with a protective zone.

The exemplary embodiment of FIG. 2 essentially differs from that of FIG. 1 in that a highly p-doped protective zone 10 is arranged between the planar zone 3 and the edge 16. Such a protective zone is usually provided in the form of a guard ring. The region 9 abuts the protective zone 10. The protective zone 10 is overlapped by the field plate. As set forth in combination with FIG. 1, the region 9 can extend up to the planar zone 3 on the side facing toward the planar zone 3. The protective zone is electrically connected to a further field plate 14. The latter extends up to the edge 16 of the semiconductor body. A further field plate 13 that is preferably identical to the gate electrode 6 is electrically connected to the field plate 14. Together, the two field plates 13, 14 have the effect of a single field plate that has an increasing distance from the surface of the semiconductor body in a direction toward the edge of the semiconductor body. The field plate 14 is arranged on an insulating layer 12. The field plate 13, however, is not critical for the present invention. A further region 15 is arranged in the surface of the second zone 2 between the protective zone 10 and the edge 16 of the semiconductor body. This further region 15 has a higher doping concentration than the zone 2 and is of the same conductivity type. Corresponding to the region 9 in the exemplary embodiment of FIG. 1, the region 15 serves the purpose of making the field strength uniform at the surface.

The planar zone 3 and the protective zone 10 together with the field plate 5 form a p-channel lateral MOSFET, whereby source terminal and gate terminal are electrically connected to one another. The breakdown voltage at the surface of the semiconductor body between the protective zone 10 and the planar zone 3 can be defined by the cut-off voltage of this MOSFET. The increase in the charge carrier concentration at the surface due to the region 9 raises the cut-off voltage of the MOSFET and, thus, the breakdown strength.

The blocking bias of a planarly constructed semiconductor component can be noticeably increased by the present invention. The increase can also be achieved when field plates that are parallel to the surface of the semiconductor body are used. A plurality of protective zones can also be arranged between the planar zone 3 and the edge 16 instead of the single protective zone 10 shown in the exemplary embodiment of FIG. 2. These protective zones are then each respectively contacted to the field plates in the recited way, a respectively inner field plate thereof overlapping the outer, neighboring protective zone. Analogously, respectively one of the regions again lies at the surface of the zone 2 between the protective zones. The exemplary embodiments show vertical power MOSFETs. The present invention, however, can also be equally well-employed for bipolar transistors or IGBT (isolated gate bipolar transistor). In the case of a bipolar transistor, the gate electrode 6 has no function, it then merely serves as a field plate. The zone 3 is then the base zone and the zone 4 is the emitter zone. The zone 3 is provided with a base terminal for controlling the bipolar transistor.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A semiconductor component comprising: a semiconductor chip having a first zone of a first conductivity type and at least one planar zone of a second conductivity type arranged in a first surface of the first zone; at last one field plate electrically connected to the planar zone and extending in a direction toward an edge region of the semiconductor chip; a channel barrier formed in the edge region of the semiconductor chip; and a region of the first conductivity type having a higher conductivity than the first zone and located in the first surface of the first zone outside of and spaced from the planar zone, the region of the first conductivity type extending from under the channel barrier to under the at least one field plate.

2. A semiconductor component comprising: a semiconductor chip having a first zone of a first conductivity type and at least one planar zone of a second conductivity type arranged in a first surface of the first zone; at least one field plate electrically connected to the planar zone and extending in a direction toward an edge region of the semiconductor chip; a channel barrier formed in the edge region of the semiconductor chip; at least one planar protective zone of the second conductivity type arranged in the first surface of the first zone between the planar zone and the edge region of the semiconductor chip; at least one second field plate electrically connected to the protective zone and extending towards the edge region of the semiconductor chip; first and second regions of the first conductivity type, each having a higher conductivity than the first zone and located in the first surface of the first zone outside of and spaced from the protective zone and outside of and spaced from the planar zone, respectively.

3. A semiconductor component comprising: a semiconductor chip having a first zone of a first conductivity type and at least one planar zone of a second conductivity type arranged in a first surface of the first zone; at least one field plate electrically connected to the planar zone and extending in a direction toward an edge region of the semiconductor chip; a channel barrier formed in the edge region of the semiconductor chip; and a region of the first conductivity type having a higher conductivity than the first zone and located in the first surface of the first zone outside of the planar zone, the region extending from under the channel barrier to under the at least one field plate.

* * * * *